(12) United States Patent
Li et al.

(10) Patent No.: US 12,388,051 B2
(45) Date of Patent: Aug. 12, 2025

(54) BARRIERS FOR GROOVES IN PHOTONICS DIES

(71) Applicant: Intel Corporation, Santa Clara, CA (US)

(72) Inventors: Xiaoqian Li, Chandler, AZ (US); Wei Li, Chandler, AZ (US); Santosh Shaw, Chandler, AZ (US); Jingyi Huang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 17/214,083

(22) Filed: Mar. 26, 2021

(65) Prior Publication Data

US 2022/0310566 A1    Sep. 29, 2022

(51) Int. Cl.
| | |
|---|---|
| *H01L 25/075* | (2006.01) |
| *G02B 6/12* | (2006.01) |
| *G02B 6/42* | (2006.01) |
| *H10H 20/855* | (2025.01) |
| *H10H 20/857* | (2025.01) |

(52) U.S. Cl.
CPC .......... *H01L 25/075* (2013.01); *G02B 6/12* (2013.01); *G02B 6/4201* (2013.01); *H10H 20/855* (2025.01); *H10H 20/857* (2025.01)

(58) Field of Classification Search
CPC ....... H01L 25/075; H01L 33/58; H01L 33/62; G02B 6/12; G02B 6/4201; G02B 6/3652; G02B 6/4204; G02B 6/4249; G02B 6/3636; H10H 20/855; H10H 20/857
See application file for complete search history.

(56) References Cited

U.S. PATENT DOCUMENTS

| | | | |
|---|---|---|---|
| 7,557,300 B2* | 7/2009 | Thompson | H01B 7/292 |
| | | | 174/74 R |
| 8,373,259 B2* | 2/2013 | Kim | G02B 6/3882 |
| | | | 257/725 |
| 9,348,094 B1* | 5/2016 | Liu | G02B 6/30 |
| 9,804,348 B2* | 10/2017 | Badihi | G02B 6/4249 |
| 2002/0097476 A1 | 7/2002 | Ishikawa et al. | |
| 2008/0008419 A1 | 1/2008 | Krahenbuhl et al. | |
| 2009/0014633 A1 | 1/2009 | Sekikawa | |
| 2009/0067779 A1* | 3/2009 | Furuyama | H05K 1/0206 |
| | | | 385/14 |
| 2012/0025209 A1* | 2/2012 | Kim | G02B 6/4292 |
| | | | 257/E33.077 |

(Continued)

FOREIGN PATENT DOCUMENTS

| | | |
|---|---|---|
| JP | 2005274700 | 10/2005 |
| JP | 2007178790 | 7/2007 |

OTHER PUBLICATIONS

European Search Report for European Patent Application No. 22150658.7 mailed Jun. 9, 2022, 9 pgs.

(Continued)

*Primary Examiner* — Caleb E Henry
(74) *Attorney, Agent, or Firm* — Schwabe, Williamson & Wyatt, P.C.

(57) ABSTRACT

Embodiments disclosed herein include photonics packages. In an embodiment, a photonics package includes a photonics die and a plurality of v-grooves on the photonics die. A barrier structure proximate the plurality of v-grooves.

22 Claims, 14 Drawing Sheets

(56) References Cited

U.S. PATENT DOCUMENTS

| | | | |
|---|---|---|---|
| 2015/0010267 A1* | 1/2015 | Levy | G02B 6/30 |
| | | | 438/31 |
| 2015/0010268 A1* | 1/2015 | Badihi | G02B 6/32 |
| | | | 438/31 |
| 2017/0003453 A1 | 1/2017 | Doany et al. | |
| 2017/0131476 A1* | 5/2017 | Gambino | G02B 6/4243 |
| 2020/0225429 A1* | 7/2020 | Nagarajan | G02B 6/4206 |
| 2021/0405311 A1* | 12/2021 | Li | G02B 6/4292 |
| 2022/0196935 A1* | 6/2022 | Li | G02B 6/4214 |
| 2022/0199881 A1* | 6/2022 | Toda | G02B 6/4269 |
| 2022/0291462 A1* | 9/2022 | Pratap | G02B 6/4228 |

OTHER PUBLICATIONS

Office Action for European Patent Application No. 22150658.7 mailed Feb. 5, 2025, 6 pgs.

* cited by examiner

BARRIERS FOR GROOVES IN PHOTONICS DIES

GOVERNMENT LICENSE RIGHTS

This disclosure was made with Government support under Agreement No. HR0011-19-3-0003, awarded by DARPA. The Government has certain rights in the disclosure.

TECHNICAL FIELD

Embodiments of the present disclosure relate to electronic packages, and more particularly to photonics dies having grooves protected by barrier structures.

BACKGROUND

The microelectronic industry has begun using optical connections as a way to increase bandwidth and performance. Typically, the optical connections include optical fibers that are mounted to v-grooves on the edge of the photonics die. The optical fibers include a pigtail design that is terminated with a multi-channel MT type optical fiber ferrule. Micro lenses can be used to provide a more compact package solution for handling and provide pluggable solutions for customers during system level assembly. However, there are currently no passive alignment features in order to simplify the alignment between the photonics die and the micro lenses. Currently, active alignment processes are needed. Active alignment processes require additional equipment, and is a time consuming process.

EMBODIMENTS OF THE PRESENT DISCLOSURE

Figure 1A:
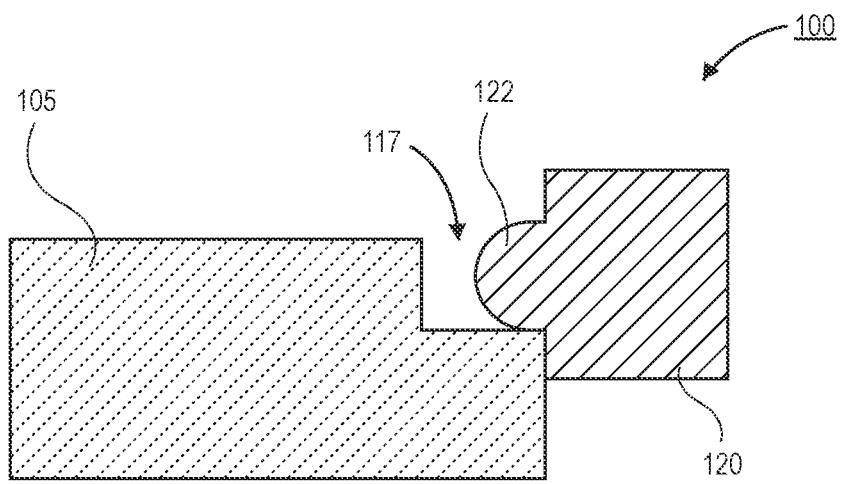
FIG. 1A is a cross-sectional illustration of a photonics die with a v-groove and a lens of a lens array inserted into the v-groove, in accordance with an embodiment.

Described herein are photonics dies having grooves protected by barrier structures, in accordance with various embodiments. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As noted above, lens arrays that are coupled to a photonics die currently require active alignment in order to provide high efficiency coupling. Active alignment requires additional equipment and is a slow process. As such, the active alignment of lens arrays is not compatible with high volume manufacturing (HVM) environments.

Accordingly, embodiments disclosed herein include passive alignment features that can be used to align a lens array with a photonics die. In some embodiments, the lens array can be attached at the die level, which potentially can enable optical testing at the die level before packaging. As such, known good dies can be used in the assembly process in order to improve yield. Additionally, the use of a passively aligned lens array may remove the need to use pigtail fiber connector solutions. As such, package assembly is simplified and pluggable connector solutions may be enabled. In an embodiment, barriers to stop first level interconnect (FLI) epoxy flow to a V-groove zone on a photonics die are described.

Embodiments disclosed herein include various passive alignment features that may be used. In a first embodiment, lenses extending out from a main body of the lens array may be disposed into v-grooves on the photonics die. In other embodiments, dedicated alignment pins on the lens array may be inserted into v-grooves on the photonics die. The alignment pins may be on the same surface as the lenses or on the opposite surface from the lenses. Such embodiments allow for proper alignment of the alignment pins to the lenses even when the alignment pins are on the opposite surface from the lenses. In yet another embodiment, the lens array may include a saw-toothed surface that interfaces with the v-grooves of the photonics die. In some embodiments, a fiber array may be used to slot fibers into the v-grooves of the photonics die. In such embodiments, the lens may be a discrete component attached to the fibers, or the fibers may terminate with a lensed surface. Additional embodiments may include a lens array with an L-shaped body and cylindrical pillars that nest into the v-grooves of the photonics die. Another embodiment may include a lens array with cylindrical waveguides on one surface an lenses on the opposite surface that are optically coupled with the cylindrical waveguides. The cylindrical waveguides may rest in the v-grooves of the photonics die.

Referring now to FIG. 1A, a cross-sectional illustration of a photonics package 100 is shown, in accordance with an embodiment. In an embodiment, the photonics package 100 may include a photonics die 105. The photonics die 105 may be a die that is configured to convert optical signals into electrical signals and/or convert electrical signals into optical signals. The photonics die 105 may be coupled to a processor die (not shown) that operates in the electrical regime.

In an embodiment, the photonics die 105 may include a plurality of v-grooves 117. The v-grooves 117 may be aligned with the spot size converter (not shown) that interfaces with an optical waveguide of the photonics die 105. The spot size converter may be provided at an end surface of the v-groove 117 (i.e., the left end of the v-groove 117 in FIG. 1A).

In an embodiment, the photonics package 100 may further include a lens array. The lens array may include an optically clear body 120 and a plurality of lenses 122. The lens array may be formed of glass or an optically clear polymer material. The lenses 122 may be formed with an etching process or the optically clear body 120 and the lenses 122 may be formed with a molding process. The lenses 122 may extend out from the optically clear body 120.

As shown, the lenses 122 may sit in the v-grooves 117 of the photonics die 105. That is, the lenses 122 are passively aligned with the spot size converter of the photonics die 105 by the v-grooves 117. As such, there is no need for active alignment of the lenses 122. The spacing of the lenses 122 with respect to each other can be tightly controlled by the etching or molding process used to form the lenses 122, and the proper alignment with the photonics die 105 is provided by the structure of the v-grooves 117.

In an embodiment, the lens array may be attached to the photonics die 105 at the die level. Such assembly allows for the photonics die 105 to be tested at an early point of assembly. Therefore, subsequent assembly processes may be able to proceed with known good dies. The use of known good die assembly improves the overall yield of the assembled product.

Figure 1B:
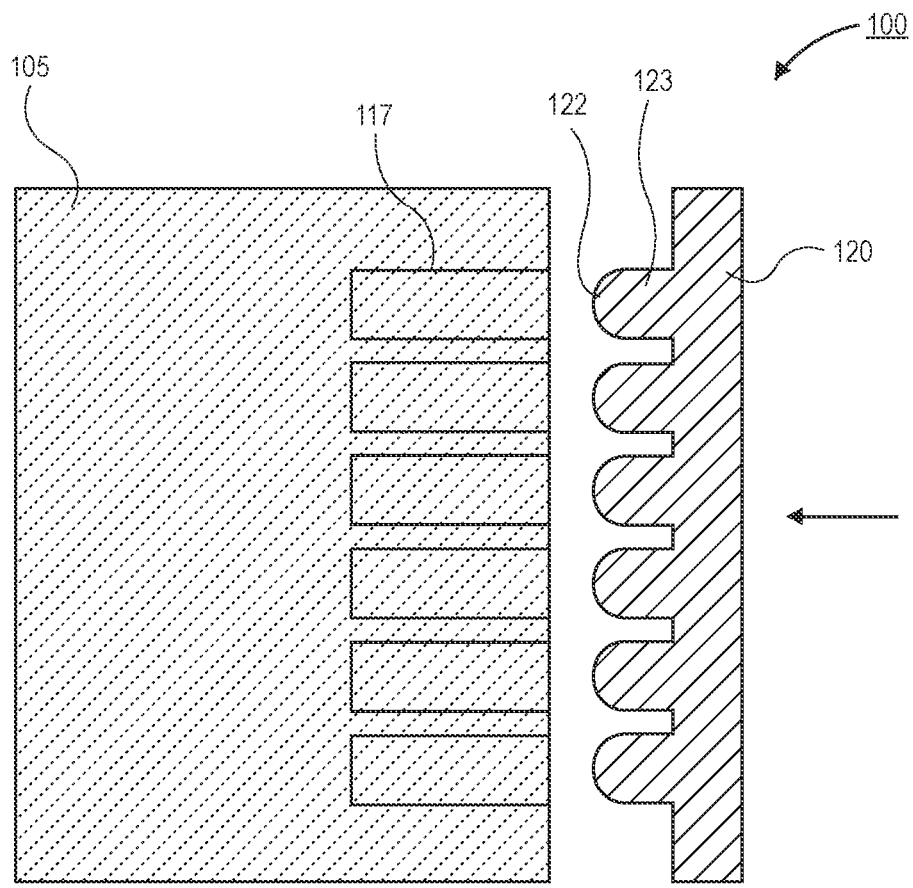
FIG. 1B is a plan view illustration of the photonics die and the lens array showing the alignment between the lenses and the v-grooves of the photonics die, in accordance with an embodiment.

Referring now to FIG. 1B, a plan view illustration of the photonics package 100 is shown, in accordance with an embodiment. As shown, a plurality of lenses 122 are provided along a length of the lens body 120. While six lenses 122 are shown, it is to be appreciated that the lens array may include any number of lenses 122 in order to match the design of the photonics die 105. For example, the lens array may include eight lenses 122, twelve lenses 122, sixteen lenses 122, or twenty-four lenses 122. In an embodiment, the lenses 122 may be provided at the end of cylindrical posts 123. The cylindrical posts 123 increases the length of the lens array that interfaces with the v-grooves 117. In other embodiments, the lenses 122 may be directly protruding from the lens body 120, and the cylindrical posts 123 may be omitted.

In an embodiment, the lens array is brought towards the photonics die 105, as indicated by the arrow. The lenses 122 then slot into the v-grooves 117 on the photonics die 105. In an embodiment, the lenses 122 and the cylindrical posts 123 may have a total length that is less than a length of the v-grooves 117. In other embodiments, the lenses 122 and the cylindrical posts 123 may have a length that is substantially equal to the length of the v-grooves 117 or even a length that is greater than the length of the v-grooves 117. As shown, the number of v-grooves 117 may be equal to the number of lenses 122. That is, each v-groove 117 accommodates a single one of the lenses 122.

In accordance with one or more embodiments described herein, barriers to inhibit or stop first level interconnect (FLI) epoxy flow to a V-groove zone on a photonics die are described. To provide context, a V-groove feature can be fabricated on photonics Si to enable fiber passive alignment during fiber attach. In some photonics package architectures, a photonics die is over-hanging on the substrate edge. The V-groove can subsequently be accessed by a fiber array. A fabrication process flow can include chip attach, then FLI underfill, then integrated heat spreader (HIS) attach, then ball attach, and then fiber attach with optical epoxy to fill the fiber tip to Si waveguide gap. With such a process flow, in some embodiments, it may need to be ensured the FLI underfill material does not overflow to the V-groove region, since a different epoxy may need to be used in the V-groove zone for optical purposes.

Figure 2:
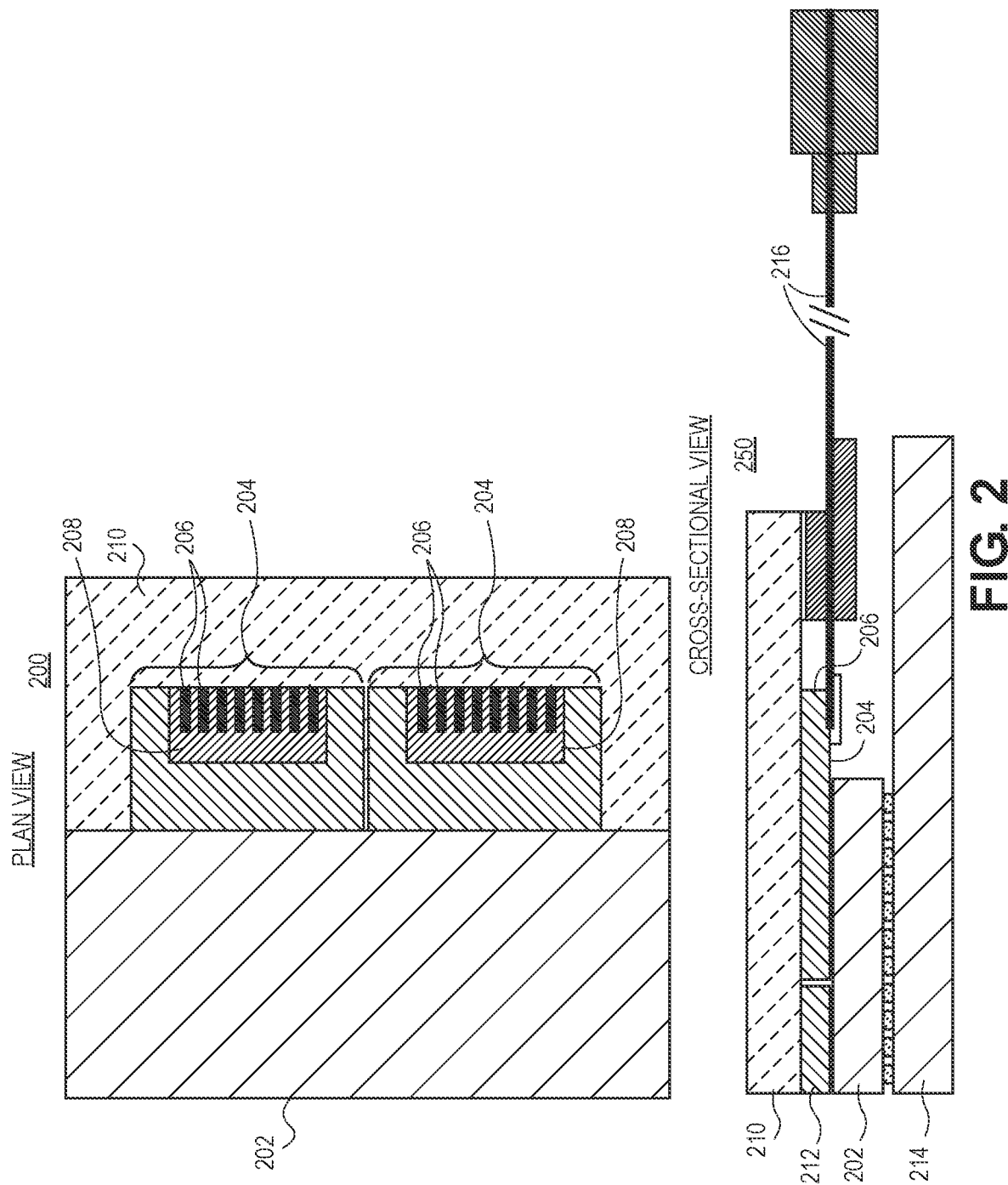
FIG. 2 illustrates a plan view and a cross-sectional view of a photonics package prior to and after fiber attach, respectively, in accordance with an embodiment of the present disclosure.

FIG. 2 illustrates a plan view and a cross-sectional view of a photonics package prior to and after fiber attach, respectively, in accordance with an embodiment of the present disclosure.

Referring to FIG. 2, a photonics package 200 or 250 includes a substrate 202 having one or more photonics dies 204 thereon. Each of the photonics dies 204 includes a plurality of V-grooves 206 surrounded by a keep out zone (KOZ) 208. A field programmable gate array (FPGA) die 212 is also coupled to the substrate 202. An integrated heat spreader (HIS) 210 is coupled to the FPGA die 212 and to the photonics dies 204. The substrate 202 is coupled to a board 214. A fiber connector 216 is inserted into the V-grooves 206 of one of the photonics dies 204.

A state-of-the-art approach involves dispensing barrier materials either on the Si (204) or on the substrate 202 to control the epoxy flow. The width and position control of the barrier materials dispense may not be precise, and thus may require a large KOZ 208 for the process. In accordance with one or more embodiments of the present disclosure, barrier concepts are described herein including the fabrication of different dam or trench features from a substrate or a die side through a substrate manufacturing process or a bumping process. Both substrate manufacturing and bumping processes may have improved dimension/position control which can reduce the distance need between the bump area and the V-groove area. In one embodiment, implementation of embodiments described herein can provide a cost saving opportunity for photonics die designs. Several architectures and process flows are described below to demonstrate wafer/panel level fiber connector attach concepts.

In a first aspect, a special C4 solder joint or joints is used as a dam. In an embodiment, a special solder joints dam fabricated in C4, with same metal layers as core bumps but different geometry, through either thermal compression bonding (TCB) or a mass reflow process that is used to form regular core bump joints.

Figure 3:
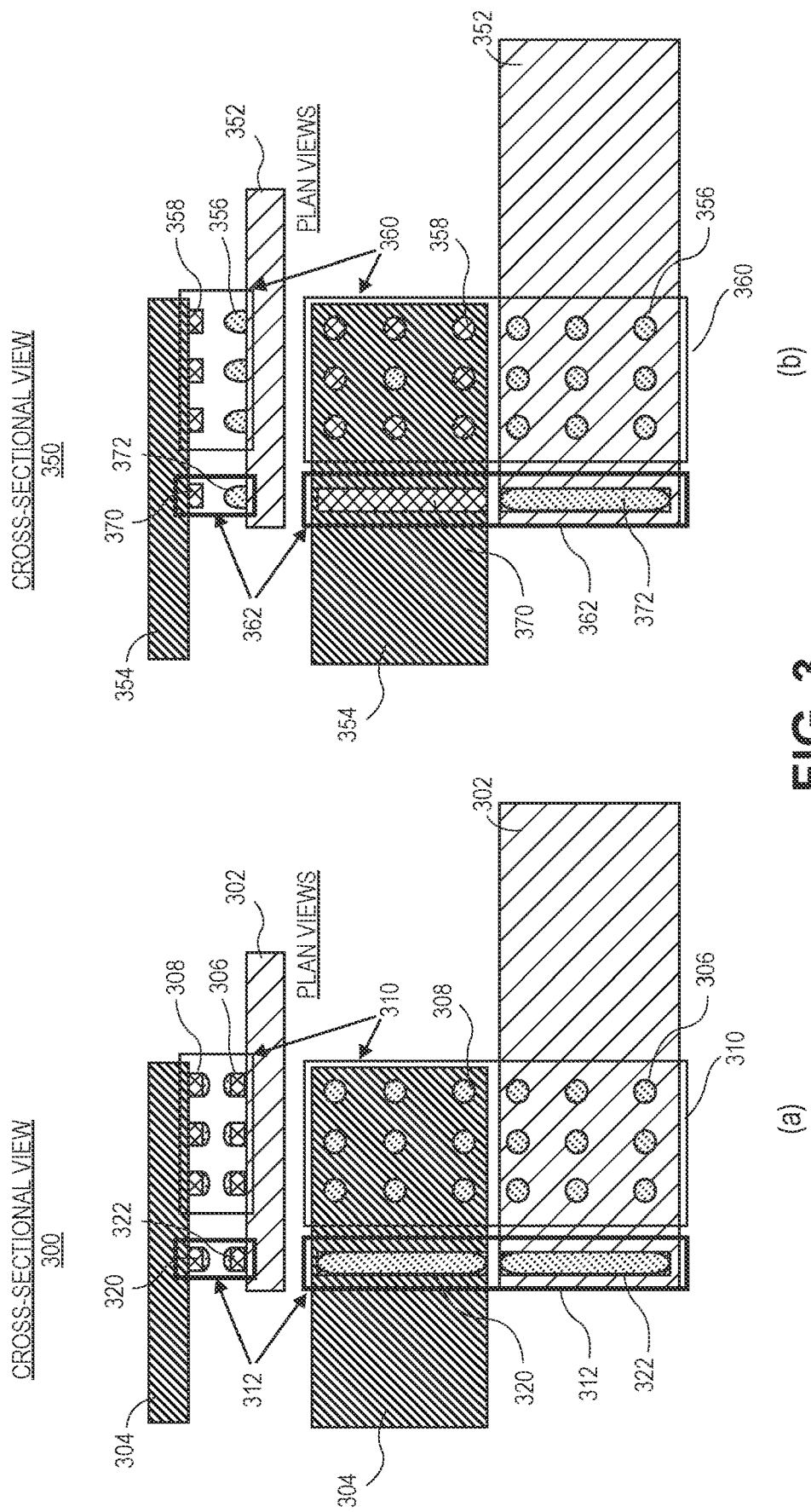
FIG. 3 illustrates cross-sectional views and plan views of die/substrate bump designs for a metal dam, in accordance with an embodiment of the present disclosure.

FIG. 3 illustrates cross-sectional views and plan views of die/substrate bump designs for a metal dam, in accordance with an embodiment of the present disclosure.

Referring to part (a) of FIG. 3, a photonics package 300 includes a die 304 coupled to a substrate 302. The substrate 302 and die 304 are coupled in a core bump region 310 by soldered substrate bumps 306 and soldered die bumps 308. A dam region 312 includes a soldered substrate bump line 322 coupled to a soldered die bump line 320. Referring to part (b) of FIG. 3, a photonics package 350 includes a die 354 coupled to a substrate 352. The substrate 352 and die 354 are coupled in a core bump region 360 by substrate solder structures 356 and non-soldered die bumps 358. A dam region 362 includes a substrate solder line 372 coupled to a die bump line 370.

Referring again to FIG. 3, in an embodiment, a substrate/die design for a metal dam is provided for both conventional and all solder on substrate (ASOS) structures. For both cases, a copper layer and solder layer on both die and substrate are fabricated in same process operations as regulator core bumps. The dam can be formed in a same assembly process as regular solder bump joints. In one embodiment, the only difference between the dam region joint and regular core bumps are their geometry.

Figure 4:
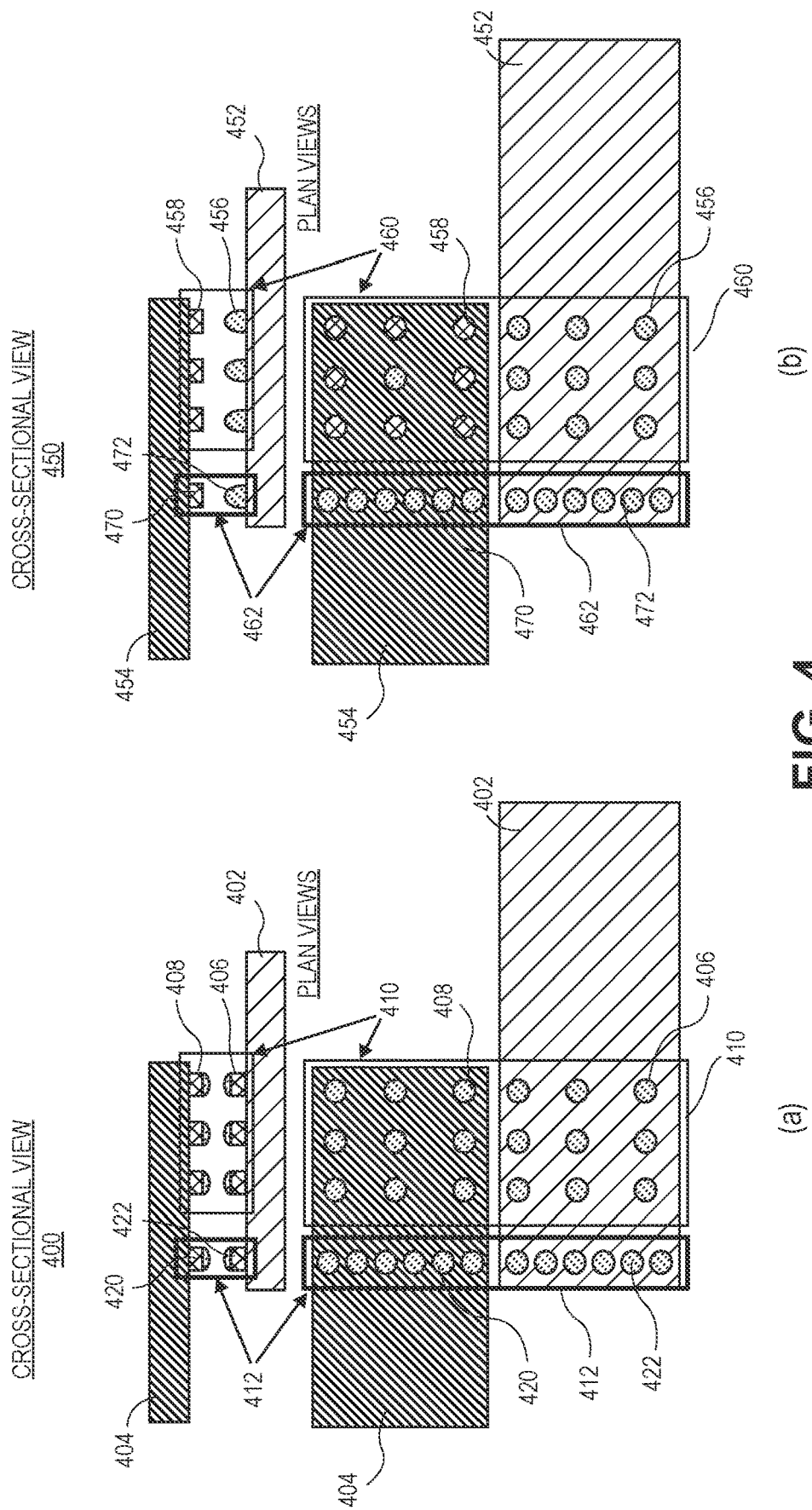
FIG. 4 illustrates cross-sectional views and plan views of die/substrate bump designs for a metal dam, in accordance with another embodiment of the present disclosure.

FIG. 4 illustrates cross-sectional views and plan views of die/substrate bump designs for a metal dam, in accordance with another embodiment of the present disclosure.

Referring to part (a) of FIG. 4, a photonics package 400 includes a die 404 coupled to a substrate 402. The substrate 402 and die 404 are coupled in a core bump region 410 by soldered substrate bumps 406 and soldered die bumps 408. A dam region 412 includes a soldered substrate bump array 422 coupled to a soldered die bump array 420. Referring to part (b) of FIG. 4, a photonics package 450 includes a die 454 coupled to a substrate 452. The substrate 452 and die 454 are coupled in a core bump region 460 by substrate solder structures 456 and non-soldered die bumps 458. A dam region 462 includes a substrate solder array 472 coupled to a die bump array 470.

Referring again to FIG. 4, in an embodiment, a dam includes individual bumps versus a continuous and a single joint as described in FIG. 3. However, in one embodiment, the individual bumps have a finer pitch compared to regular core bumps. Thus, the individual bumps in the design of FIG. 4 can form bridged joints during TCB or mass reflow, and there is a possibility of tiny holes between those joints. However, as long as the hole is small enough to prevent epoxy spreading out of KOZ, such special C4 solder joints may be sufficient to act as a dam.

In a second aspect, a special polyamide or copper construct is used to act as a barrier for epoxy/materials spread. In an embodiment, dam features are fabricated from either Polyamide (PI) or Copper (Cu). Both such materials can be coated or plated during a bumping process on a Silicon die/chip. In a first scheme, a structure is built either in the PI blanket or fabricated from PI. If a PI blanket is not required in the KOZ area (area between the bump field and V-groove or any feature where epoxy spread is undesirable), such as described in association with part (a) of FIG. 5, then a construction that of combination of dam and trench (or can be referred to as a double sided dam) is created with PI lithography around the feature as a barrier for epoxy spreading in that location. On the other hand, if PI is needed in the KOZ area, such as described in association with part (b) of FIG. 5, then PI lithography can be used to develop a trench around the V-groove or any other area to prevent epoxy spread to that area. In an embodiment, either of the double-sided dam or trench can be created near the bump field area as barrier and slow the epoxy/or other materials spread to undesirable region.

Figure 5:
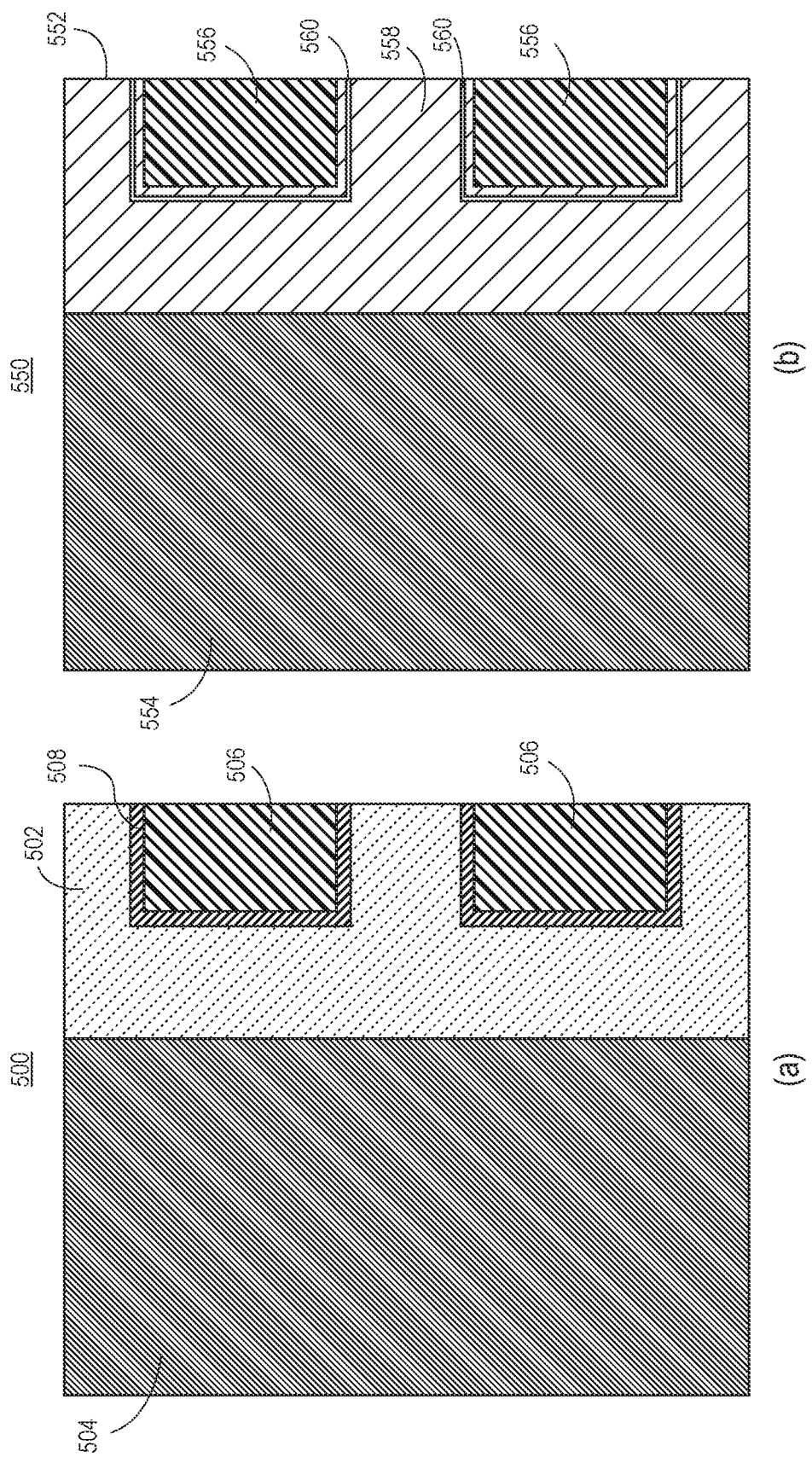
FIG. 5 illustrates plan views of a polyamide dam plus trench structure around a V-groove area or a polyamide trench around a V-groove area, in accordance with an embodiment of the present disclosure.

FIG. 5 illustrates plan views of a polyamide dam plus trench structure around a V-groove area or a polyamide trench around a V-groove area, in accordance with an embodiment of the present disclosure.

Referring to part (a) of FIG. 5, a photonics die 500 includes an exposed silicon region 502 and a core and microbump region 504. One or more V-groove regions 506 are surrounded by corresponding polyamide dam plus trench structures 508. Referring to part (b) of FIG. 5, a photonics die 550 includes a PI coating 558 on a silicon region 552. The photonics die 550 also includes a core and microbump region 554. One or more V-groove regions 556 are surrounded by corresponding polyamide trench structures 560. It is to be appreciated that, in other embodiments (not depicted), a single dam, a single dam plus trench or a single trench structure surrounds two or more V-groove regions.

Figure 6:
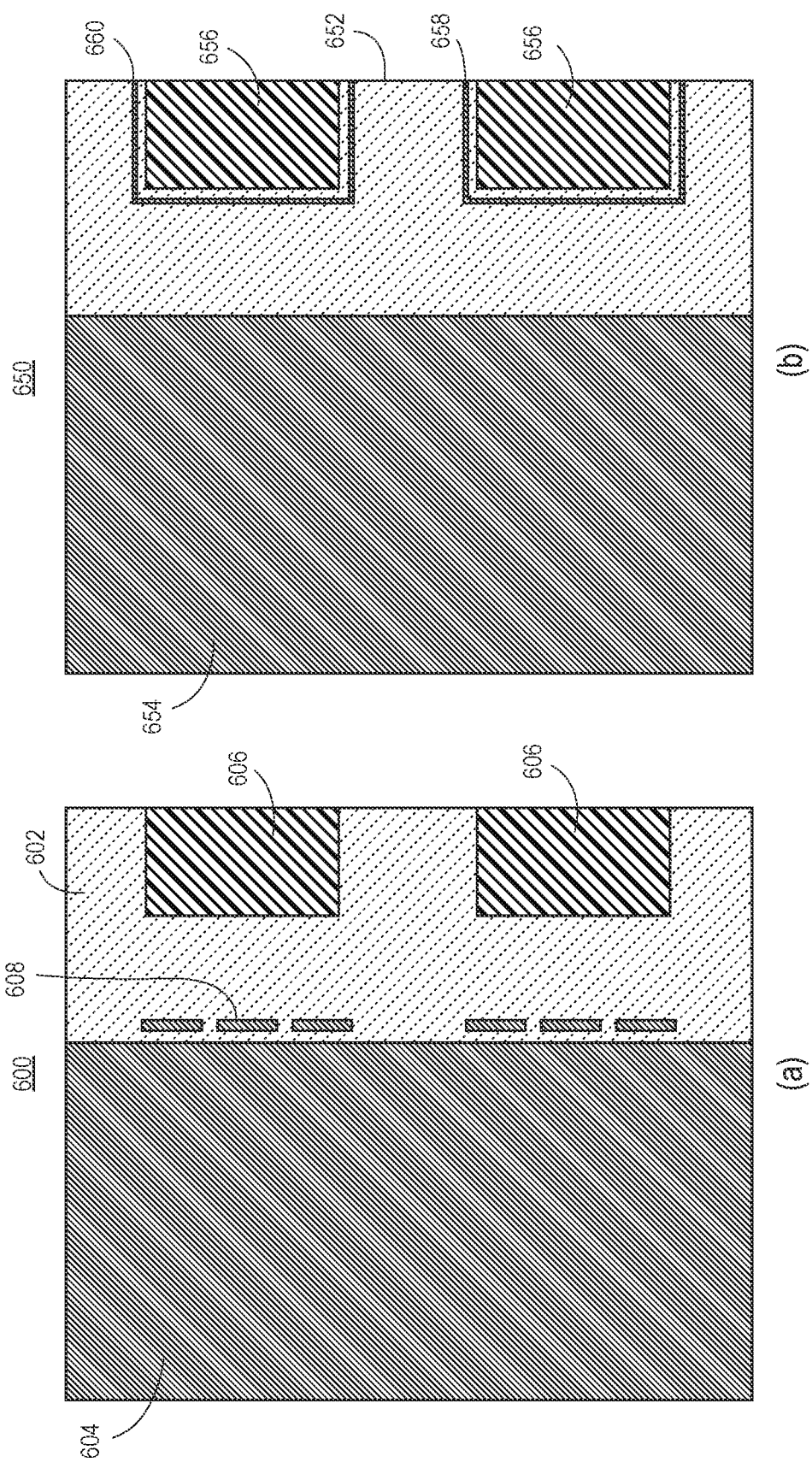
FIG. 6 illustrates plan views of copper dam structures proximate V-groove areas, in accordance with an embodiment of the present disclosure.

In a second aspect, a copper (Cu) construct can be fabricated as a barrier feature for epoxy or other materials. Copper plating is part of the bumping process to plate a Cu pillar for bump/interconnect. In FIG. 6, a Cu structure is described for obstructing or slowing an epoxy spread. In one case, Cu walls are fabricated near the bump field region to slow the speed of epoxy spread which is not only for epoxy spreading to undesired area (in this case V-groove region) but can potentially save the real estate between a bump field and a V-groove region which can otherwise potentially effectively reduce the die area (if desired). In another case, a Cu wall is fabricated as a dam as C-shaped around the V-groove (or any area) as a barrier for epoxy or any other materials to spread over the region. In an embodiment, if there are aggressive KOZ requirements, a combination of both can be used to both slow and prevent epoxy or any other materials spread. In some embodiments, both PI and Cu can be combined where needed as both can be fabricated as part of a bumping process and can be fabricated without disrupting the regular process.

FIG. 6 illustrates plan views of Cu dam structures proximate V-groove areas, in accordance with an embodiment of the present disclosure.

Referring to part (a) of FIG. 6, a photonics die 600 includes an exposed silicon region 602 and a core and microbump region 604. One or more V-groove regions 606 are protected by corresponding copper wall structures 608. Referring to part (b) of FIG. 6, a photonics die 650 includes an exposed silicon region 652 and a core and microbump region 654. One or more V-groove regions 656 are surrounded by corresponding Cu dam structures 658.

Figure 7A:
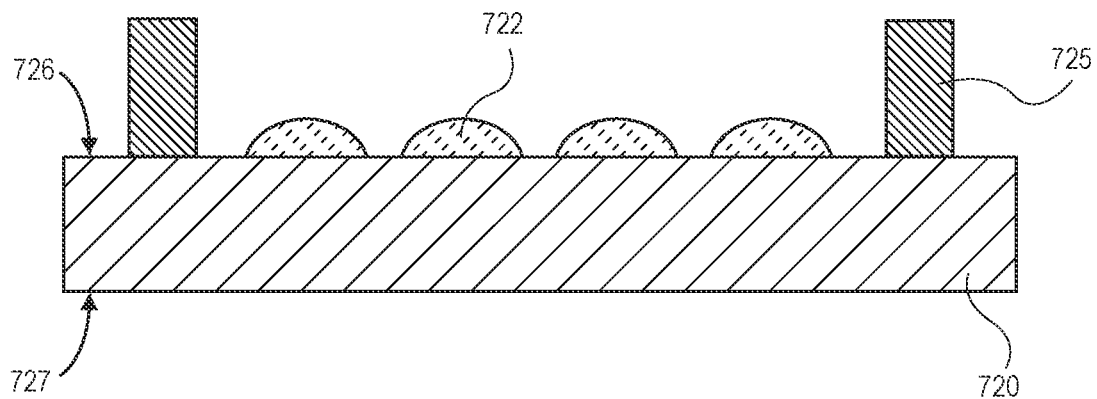
FIG. 7A is a cross-sectional illustration of a lens array with a pair of alignment pins, in accordance with an embodiment.

Referring now to FIG. 7A, a cross-sectional illustration of a lens array is shown, in accordance with an additional embodiment. In an embodiment, the lens array includes a main body 720 and a plurality of lenses 722 extending out from the main body 720. The main body 720 and the lenses 722 may be an optically clear material, such as glass or an optically clear polymer. The main body 720 may have a first surface 726 and a second surface 727 that is opposite from the first surface 726. In an embodiment, the lenses 722 may extend out from the first surface 726.

In an embodiment, the lens array may further include alignment pins 725. The alignment pins 725 may also extend out from the first surface 726. That is, the alignment pins 725 and the lenses 722 may extend out from the same surface of the main body 720. In an embodiment, while shown as a different shading, it is to be appreciated that the alignment pins 725, the lenses 722, and the main body 720 may be formed from a single material as a monolithic structure. The alignment pins 725 and the lenses 722 may be formed with an etching process. Since the alignment pins 725 and the lenses 722 are on the same first surface 726 of the main body, the alignment between the alignment pins 725 and the lenses 722 may be tightly controlled. As such, when the alignment pins 725 are properly aligned with the photonics die (not shown in FIG. 7A), the lenses 722 will also be properly aligned with the photonics die.

In FIG. 7A, four lenses 722 are shown. However, it is to be appreciated that the lens array may include any number of lenses 722 in order to accommodate the photonics die. The alignment pins 725 are provided on opposite ends of the lenses 722. That is, a first alignment pin 725 is on the left side of the lenses 722, and a second alignment pin 725 is on the right side of the lenses 722. In other embodiments, more than two alignment pins 725 may be used.

Figure 7B:
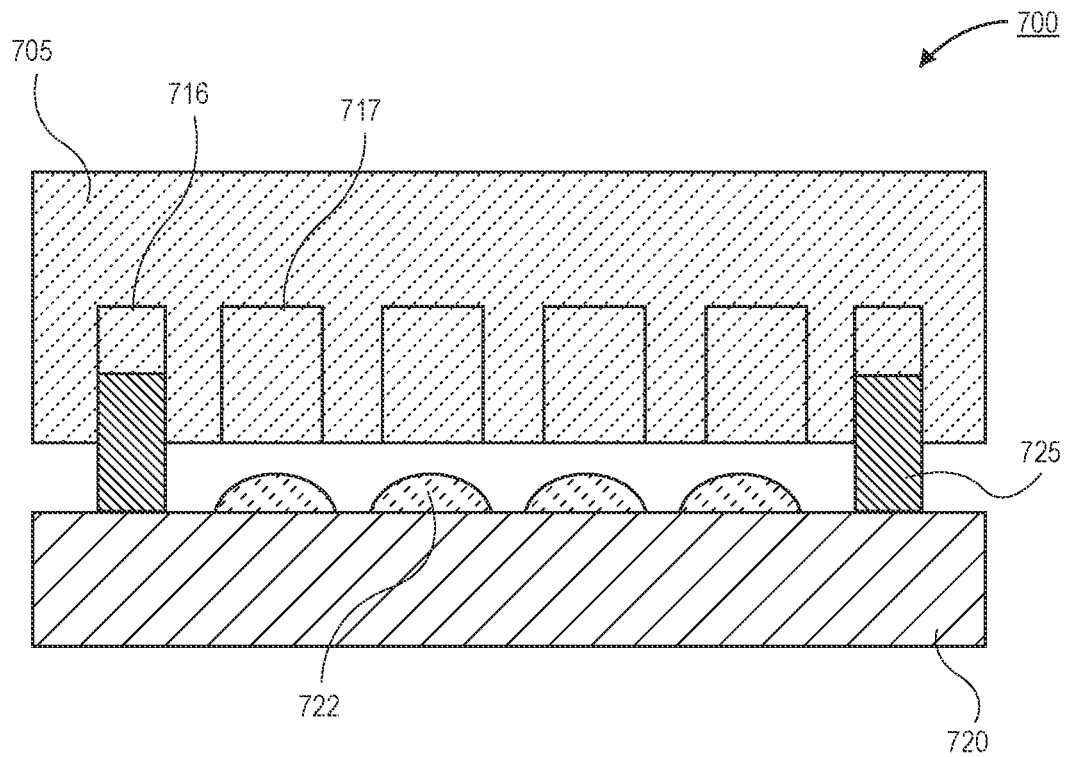
FIG. 7B is a plan view illustration of a lens array interfacing with a photonics die, where the alignment pins are inserted into v-grooves on the photonics die, in accordance with an embodiment.

Referring now to FIG. 7B, a plan view illustration of a photonics package 700 is shown, in accordance with an embodiment. As shown, a lens array is coupled to a photonics die 705. The lens array may be substantially similar to the lens array describe above with respect to FIG. 7A. For example, alignment pins 725 and lenses 722 may extend out from the same surface of the main body 720. In an embodiment, the alignment pins 725 may be inserted into v-grooves 716 on the photonics die 705. The v-grooves 716 may be for alignment purposes only. For example, the v-grooves 716 may not necessarily function as part of the optical path for optical signals to/from the photonics die 705. The v-grooves 716 may be a different dimension than the v-grooves 717 (which are used for optical signaling) in some embodiments. In other embodiments, the v-grooves 716 may be substantially the same dimension as the v-grooves 717. In an embodiment, the lenses 722 may remain outside of the v-grooves 717, as shown in FIG. 7B. In other embodiments, the lens array may be inserted so that the alignment pins 725 are inserted into the v-grooves 716, and the lenses 722 are inserted into the v-grooves 717. In accordance with one or more embodiments of the present disclosure, the photonics die 705 includes a barrier structure proximate the v-grooves 716 and/or 717, where exemplary such barrier structures are described above in association with FIGS. 3-6.

Figure 8A:
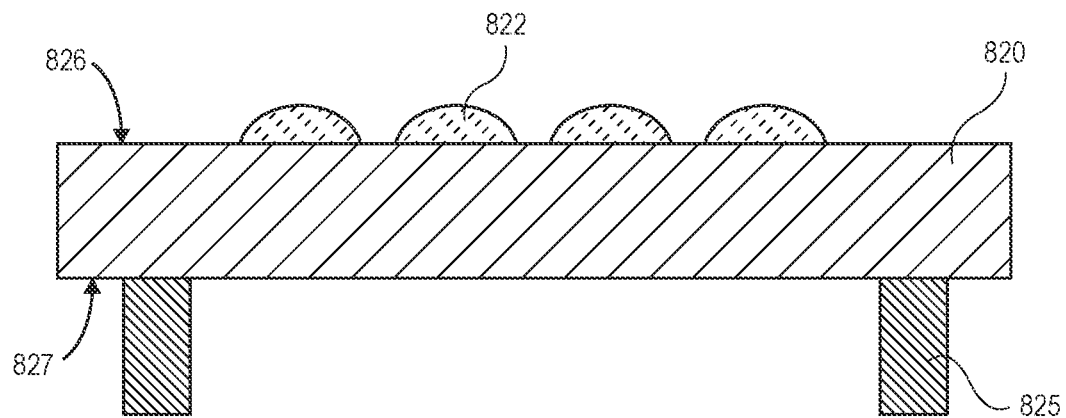
FIG. 8A is a cross-sectional illustration of a lens array with a pair of alignment pins that are provided on an opposite surface from the lenses, in accordance with an embodiment.

Referring now to FIG. 8A, a cross-sectional illustration of a lens array is shown, in accordance with an additional embodiment. In an embodiment, the lens array includes a main body 820. The main body 820 has a first surface 826 and a second surface 827 opposite from the first surface 826. A plurality of lenses 822 may extend out from the first surface 826, and alignment pins 825 may extend out from the second surface 826. That is, the lenses 822 and the alignment pins 825 may be on opposite surfaces of the main body 820.

In an embodiment, the alignment pins 825, the lenses 822, and the main body 820 may be formed from a single material and be a monolithic structure. For example, an etching or molding process of an optically clear material (e.g., glass or an optically clear polymer) may be used to form the lens array. In an embodiment where an etching process is used, a first etching process may be used to form the lenses 822, and a second etching process may be used to form the alignment pins 825. In such instances, careful control of the two etching processes may be necessary in order to maintain proper alignment between the alignment pins 825 and the lenses 822.

In FIG. 8A, four lenses 822 are shown. However, it is to be appreciated that any number of lenses 822 may be included on the lens array in order to accommodate a given design of the photonics die (not shown in FIG. 8A). Similarly, while two alignment pins 825 are shown, it is to be appreciated that any number of alignment pins 825 may be used. In the particular embodiment shown in FIG. 8A, a first alignment pin 825 is on a left side of the lenses 822 and a second alignment pin 825 is on a right side of the lenses 822.

Figure 8B:
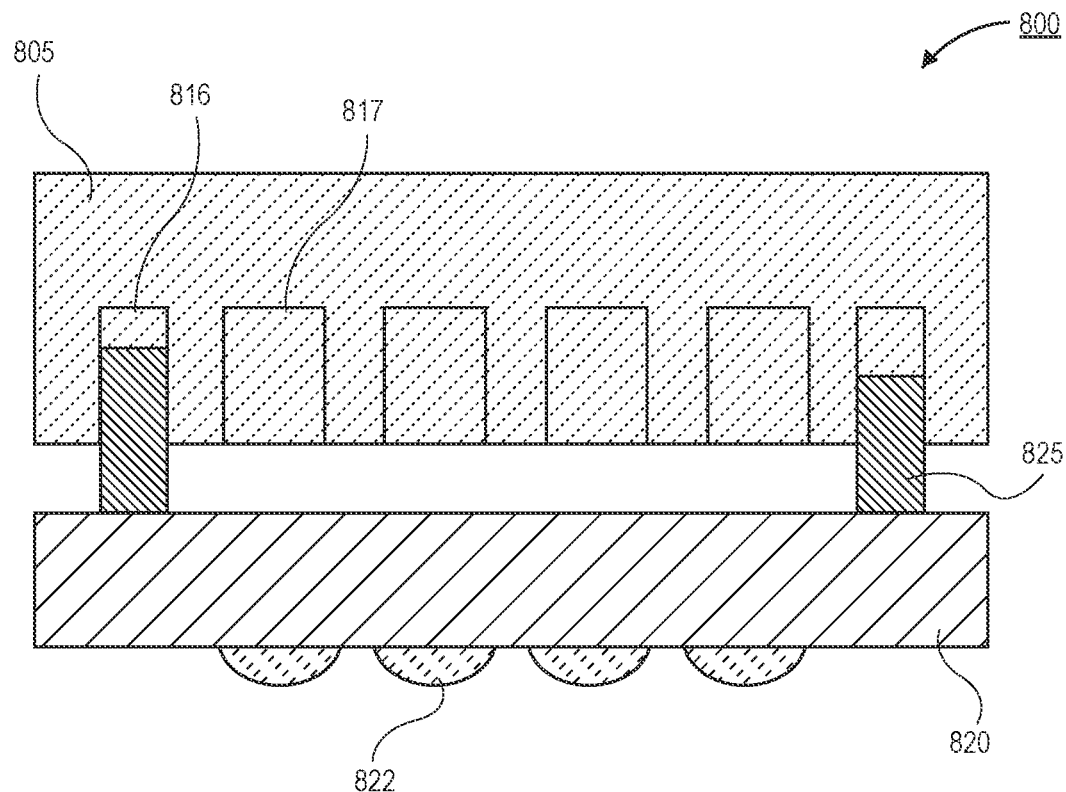
FIG. 8B is a plan view illustration of a lens array interfacing with a photonics die, where the alignment pins are inserted into v-grooves on the photonics die, in accordance with an embodiment.

Referring now to FIG. 8B, a plan view illustration of a photonics package 800 is shown, in accordance with an embodiment. The photonics package 800 includes a photonics die 805 and lens array. The lens array may be substantially similar to the lens array described with respect to FIG. 8A. As shown, the alignment pins 825 may be inserted into v-grooves 816. The lenses 822 may face away from the photonics die 805 since they are on the opposite surface of the main body 820 from the alignment pins 825.

In an embodiment, the photonics package 800 may include v-grooves 817. However, the v-grooves 817 may remain unfilled since the lenses 822 are on the opposite face of the main body 820. In other embodiments, the v-grooves 817 may be omitted, and the spot size converter may be provided at the edge of the photonics die 805. In the illustrated embodiment, the main body 820 is spaced away from an edge of the photonics die 805. However, in other embodiments, the main body 820 may be provided flush against the edge of the photonics die 805. In accordance with one or more embodiments of the present disclosure, the photonics die 805 includes a barrier structure proximate the v-grooves 816 and/or 817, where exemplary such barrier structures are described above in association with FIGS. 3-6.

Figure 9A:
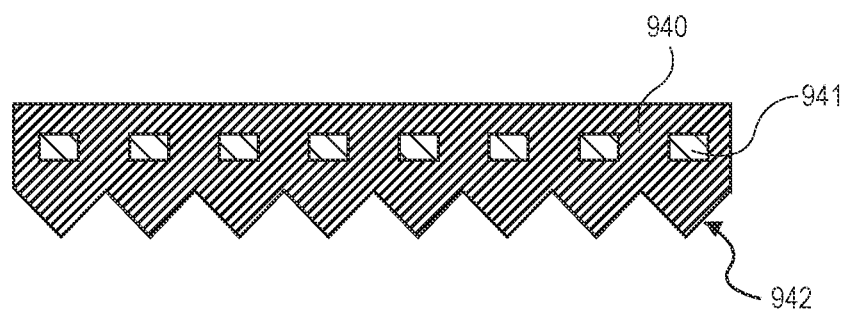
FIG. 9A is a cross-sectional illustration of a lens array with optical waveguides and a saw-tooth surface for interfacing with v-grooves on a photonics die, in accordance with an embodiment.

Referring now to FIG. 9A, a cross-sectional illustration of a lens array is shown, in accordance with an additional embodiment. In an embodiment, the lens array includes a main body 940. In an embodiment, a plurality of waveguides 941 are embedded in the main body 940. The number of waveguides 941 may be equal to the number of v-grooves in a photonics die (not shown in FIG. 9A). In an embodiment, the main body 940 may also include a saw-toothed surface 942. The saw-toothed surface 942 may interface with the v-grooves of the photonics die in order to properly align the waveguides 941 to the spot size converter. In the illustrated embodiment, the saw-toothed surface 942 is an angular surface, but in other embodiments, the saw-toothed surface 942 may be rounded. In accordance with one or more embodiments of the present disclosure, the photonics die includes a barrier structure proximate the v-grooves, where exemplary such barrier structures are described above in association with FIGS. 3-6.

Figure 9B:
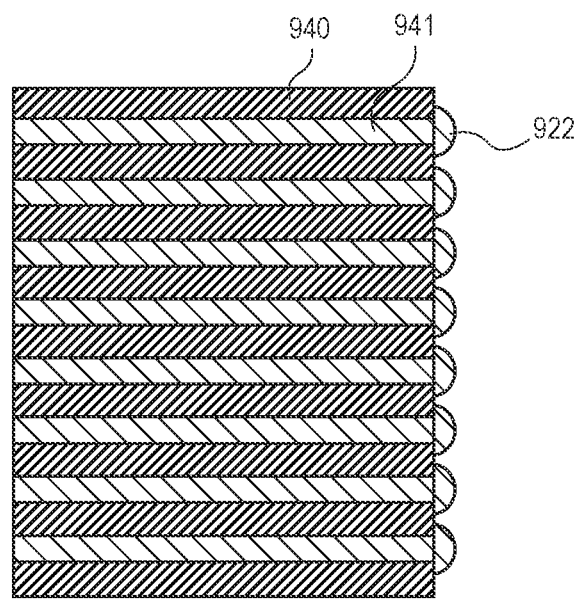
FIG. 9B is a cross-sectional illustration of the lens array showing lenses attached to the waveguides, in accordance with an embodiment.

Referring now to FIG. 9B, a cross-sectional illustration of a lens array is shown, in accordance with an additional embodiment. As shown, the waveguides 941 terminate at a lens 922. The lenses 922 may be discrete components that are attached to the waveguides 941. In other embodiments, the lenses 922 may be integrated with the waveguides 941 as a monolithic structure. In an embodiment, the lens array may be inserted into the v-grooves so that the lenses 922 are facing away from the spot size converter.

Figure 10A:
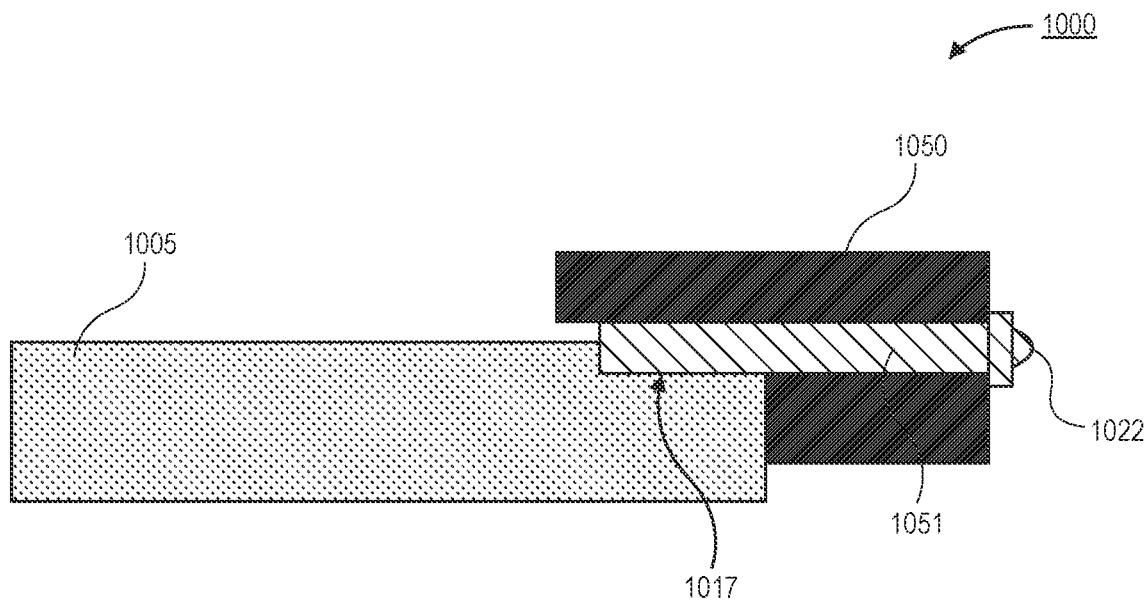
FIG. 10A is a cross-sectional illustration of a lens array with an optical fiber passing through a lens housing and a discrete lens on the end of the optical fiber, in accordance with an embodiment.

Referring now to FIG. 10A, a cross-sectional illustration of a photonics package 1000 is shown, in accordance with an embodiment. In an embodiment, the photonics package 1000 includes a photonics die 1005 and a lens array. The photonics die 1005 may include v-grooves 1017. The lens array may include a fiber housing 1050. The fiber housing 1050 houses an optical fiber 1051. The optical fiber 1051 extends out from the fiber housing 1050 and sits in the v-groove 1017. In an embodiment, the fiber housing 1050 secures together a plurality of optical fibers 1051 and allows for easy insertion into the v-grooves 1017. As such, each individual fiber does not need to be aligned and inserted into the v-grooves 1017. In accordance with one or more embodiments of the present disclosure, the photonics die 1005 includes a barrier structure proximate the v-grooves 1017, where exemplary such barrier structures are described above in association with FIGS. 3-6.

Figure 10B:
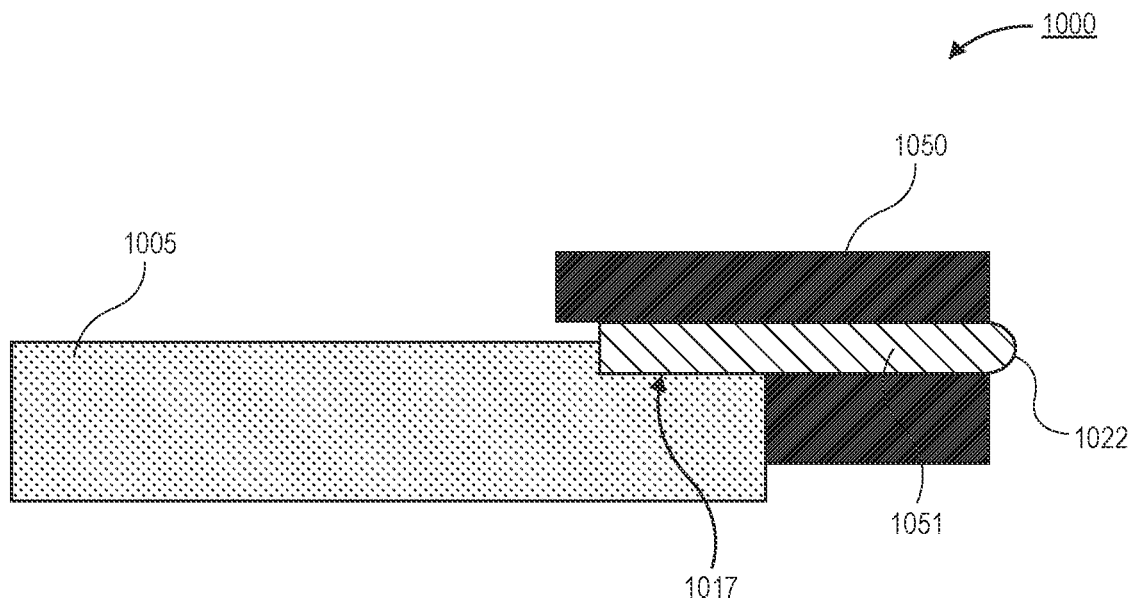
FIG. 10B is a cross-sectional illustration of a lens array with an optical fiber passing through a lens housing and a lens integrated as part of the optical fiber, in accordance with an embodiment.

In an embodiment, the optical fiber 1051 may terminate at a lens 1022. In the embodiment shown in FIG. 10A, the lens 1022 is a discrete component from the optical fiber 1051. However, as shown in FIG. 10B, the lens 1022 may be integrated as part of the optical fiber 1051. That is, the optical fiber 1051 itself can be formed into a lensed surface.

Figure 11:
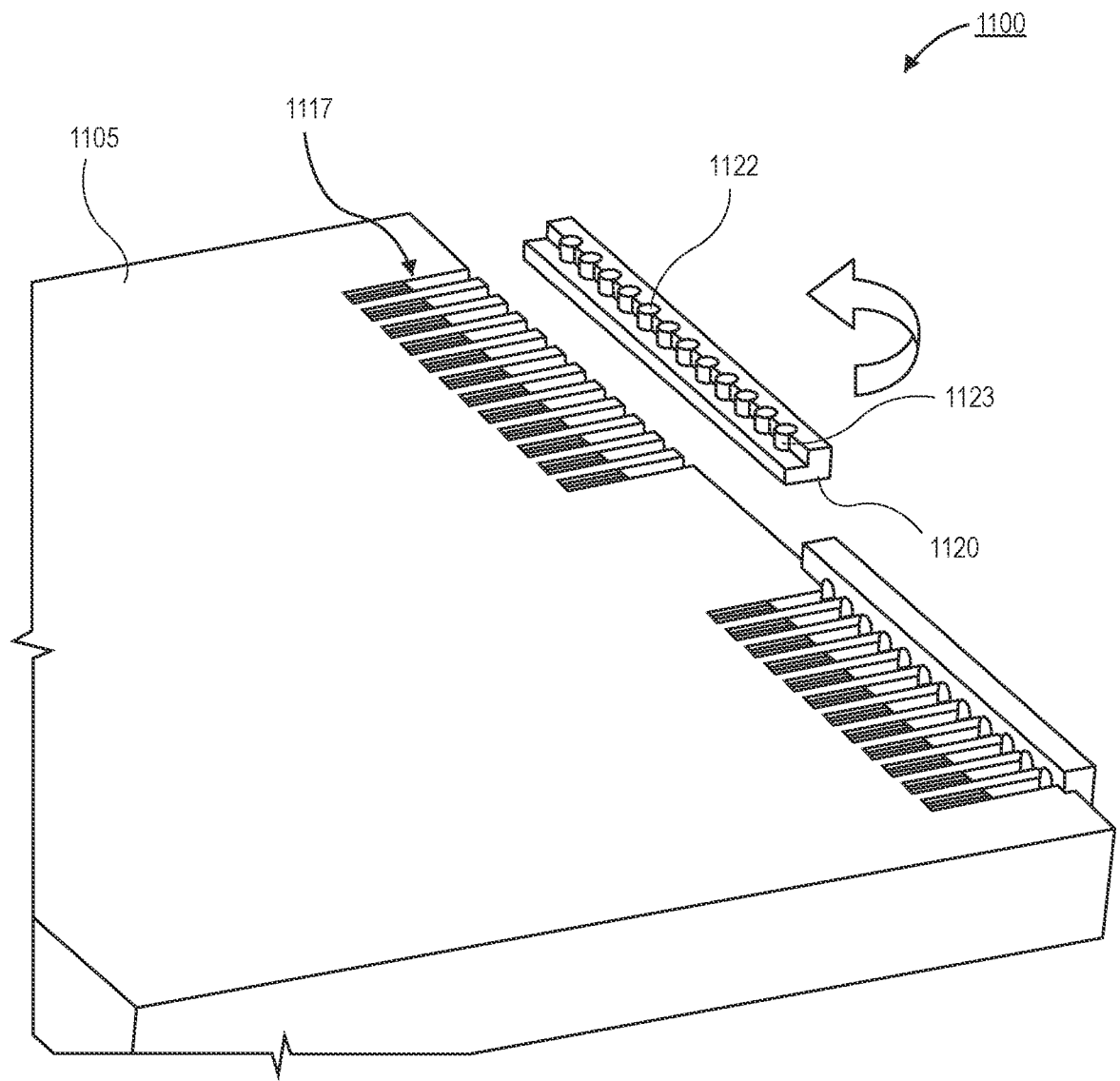
FIG. 11 is a perspective view illustration of a photonics die and an L-shaped lens array that interfaces with v-grooves on the photonics die, in accordance with an embodiment.

Referring now to FIG. 11, a perspective view illustration of a photonics package 1100 is shown, in accordance with an additional embodiment. In an embodiment, the photonics package 1100 includes a photonics die 1105 with v-grooves 1117. One or more lens arrays may be coupled to the v-grooves 1117 of the photonics die 1105. As shown in FIG. 11, a first lens array is coupled to the v-grooves 1117 and a second lens array is oriented to show the structure of the lens array. In accordance with one or more embodiments of the present disclosure, the photonics die 1105 includes a barrier structure proximate the v-grooves 1117, where exemplary such barrier structures are described above in association with FIGS. 3-6.

As shown, the lens array may include a body 1120 with an L-shaped cross-section. Cylindrical pillars 1123 may extend out from a surface of the body 1120. The cylindrical pillars 1123 may be sized to fit into the v-grooves 1117 of the photonics die 1105. Ends of the cylindrical pillars 1123 may be lenses 1122. By sitting the cylindrical pillars 1123 into the v-grooves 1117, the lenses 1122 become properly aligned.

In an embodiment, the lens array may be formed from a single optically clear material. For example, a glass or an optically clear polymer may be used. The cylindrical pillars 1123 and the lenses 1122 may be formed with an etching process. Particularly only a single surface of the lens array needs to be etched in some embodiments.

Figure 12A:
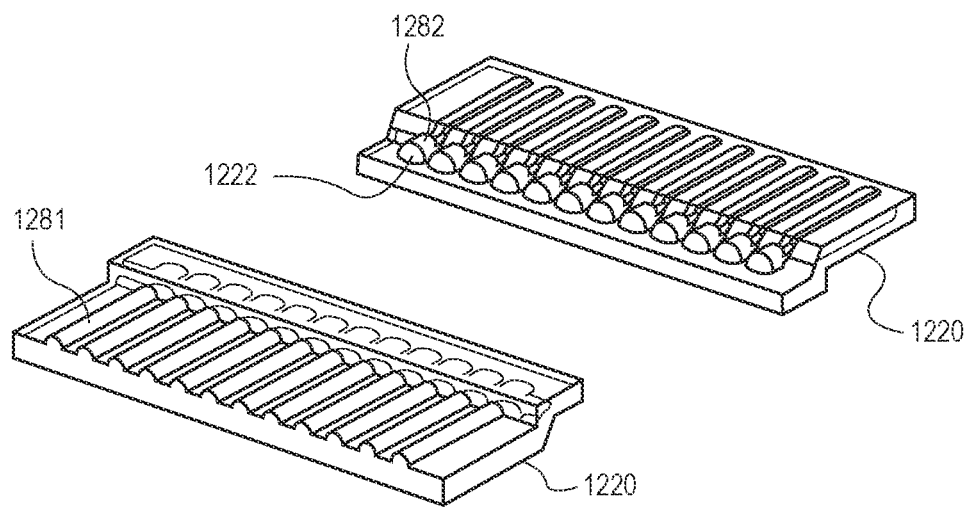
FIG. 12A is a pair of lens arrays in different orientations, in accordance with an embodiment.

Referring now to FIG. 12A, a pair of lens arrays are shown, in accordance with an embodiment. The two lens arrays shown are the same, but are oriented in different directions in order to see all of the features clearly. As shown in the bottom lens array, cylindrical waveguides 1281 are provided on a recessed surface of the main body 1220. As shown in the top lens array, cylindrical waveguides 1282 that end with lenses 1222 are shown. The cylindrical waveguides 1282 and 1281 may be optically coupled together. That is, an optical signal can propagate from the cylindrical waveguide 1281 to the cylindrical waveguide 1282, and ultimately to the lens 1222.

In an embodiment, the lens arrays may be fabricated with an etching process or a molding process. In an etching process, a first etch may be used to form the cylindrical waveguides 1281 and a second etching process may be used to form the cylindrical waveguides 1282 on the opposite surface of the main body 1220. A molding process may provide a more tight alignment between the cylindrical waveguides 1281 and the cylindrical waveguides 1282.

Figure 12B:
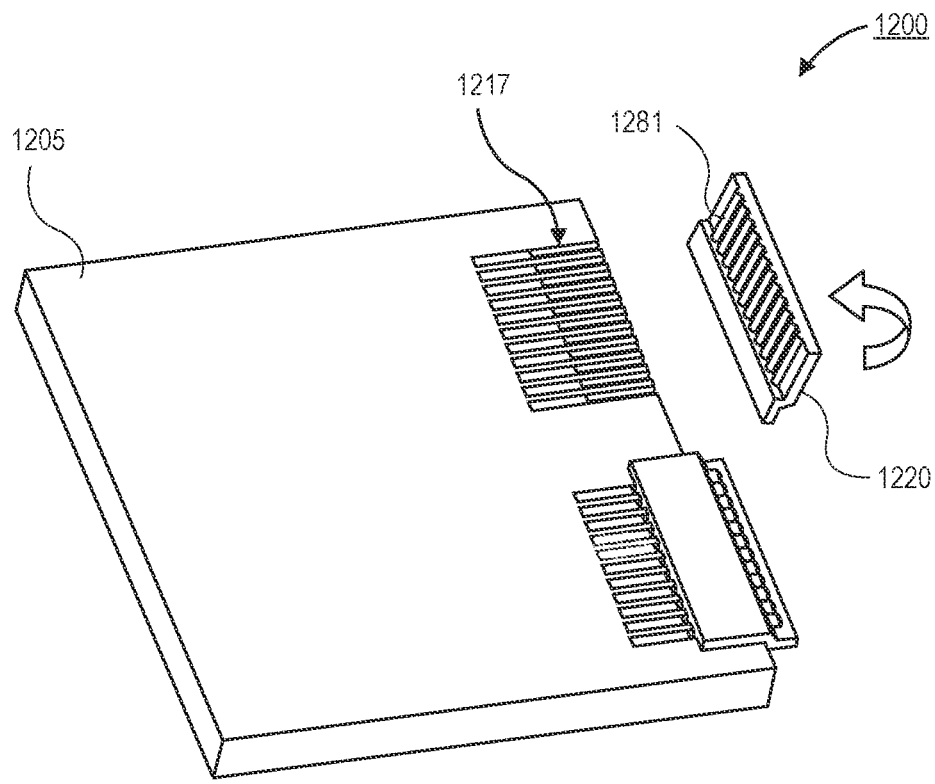
FIG. 12B is a perspective view illustration of a photonics die and lens arrays similar to those shown in FIG. 12A interfacing with v-grooves on the photonics die, in accordance with an embodiment.

Referring now to FIG. 12B, a perspective view illustration of a photonics package 1200 is shown, in accordance with an embodiment. The photonics package 1200 includes a photonics die 1205 with v-grooves 1217. A first lens array is shown on the photonics package 1200 and a second lens array is oriented to see the structure that interfaces with the v-grooves 1217. As shown, the cylindrical waveguides 1281 align with the v-grooves 1217. As such, a passive alignment is provided. In accordance with one or more embodiments of the present disclosure, the photonics die 1205 includes a barrier structure proximate the v-grooves 1217, where exemplary such barrier structures are described above in association with FIGS. 3-6.

Figure 13:
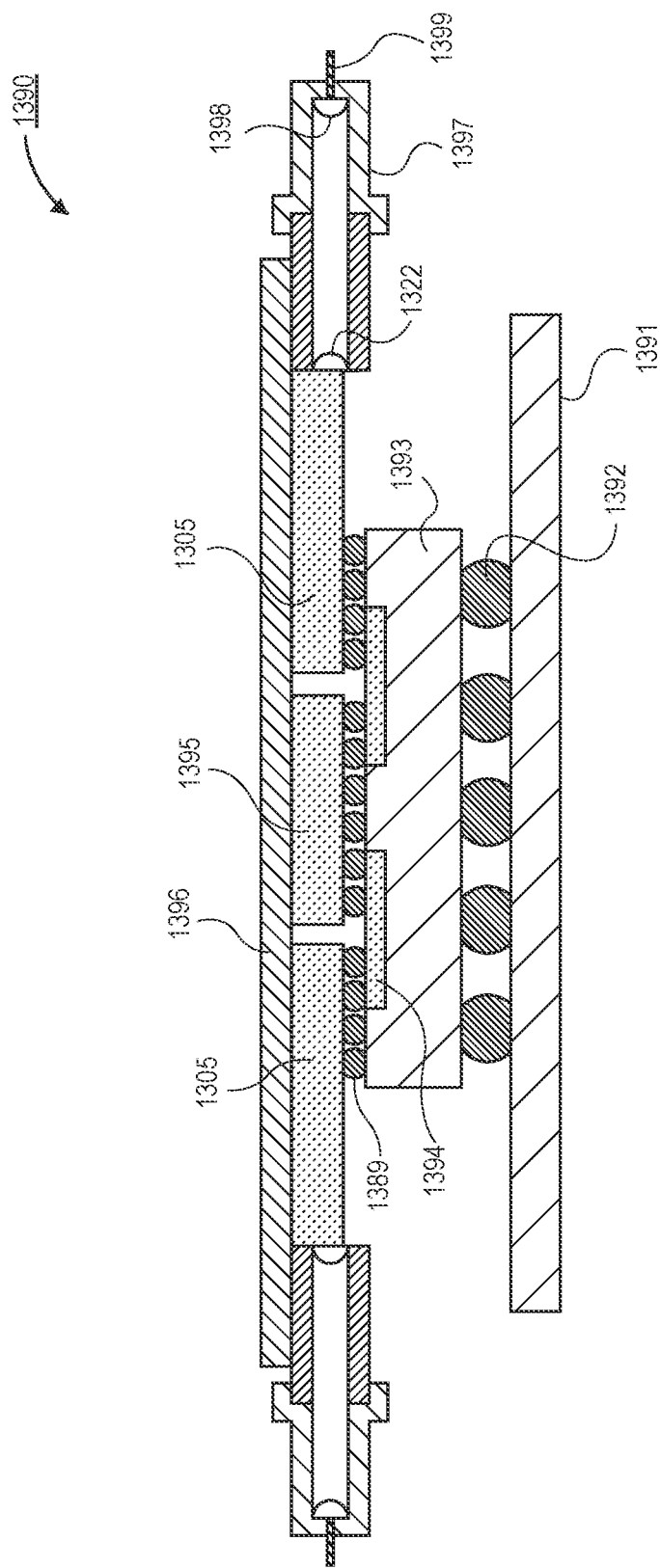
FIG. 13 is a cross-sectional illustration of a photonics package with lens arrays attached to the photonics dies, in accordance with an embodiment.

Referring now to FIG. 13, a cross-sectional illustration of a photonics system 1390 is shown, in accordance with an embodiment. In an embodiment, the photonics system 1390 may include a board 1391, such as a printed circuit board (PCB). The board 1391 may be coupled to a package substrate 1393 by interconnects 1392. The interconnects 1392 are shown as solder balls, but it is to be appreciated that any interconnect architecture may be used, such as, but not limited to, socketing architectures. In an embodiment, a processor 1395 and photonics dies 1305 may be coupled to the package substrate 1393 by interconnects 1389. In an embodiment, the photonics dies 1305 may be communicatively coupled to the processor 1395 by embedded bridges 1394 or by any other high density interconnect architecture. An integrated heat spreader (IHS) 1396 may be thermally coupled to the backside surfaces of the photonics dies 1305 and the processor 1395.

In an embodiment, an array of lenses 1322 may be provided along edges of the photonics dies 1305. The lenses 1322 may be passively aligned to the optical path of the photonics dies 1305 using any of the lens array architectures described in greater detail above. For example, portions of the lens array may interface with v-grooves of the photonics dies 1305. In accordance with one or more embodiments of the present disclosure, the photonics die 1305 includes a barrier structure proximate the v-grooves, where exemplary such barrier structures are described above in association with FIGS. 3-6.

In an embodiment, an external plug 1397 may interface with the lenses 1322. Any plugging architecture may be used. The external plug 1397 may include a second lens 1398 that interfaces with an optical cable 1399. The lenses 1322 and the lenses 1398 may be collimating lenses to provide expanded beam coupling. Expanded beam coupling eases the alignment tolerances and provides for improved optical coupling.

Figure 14:
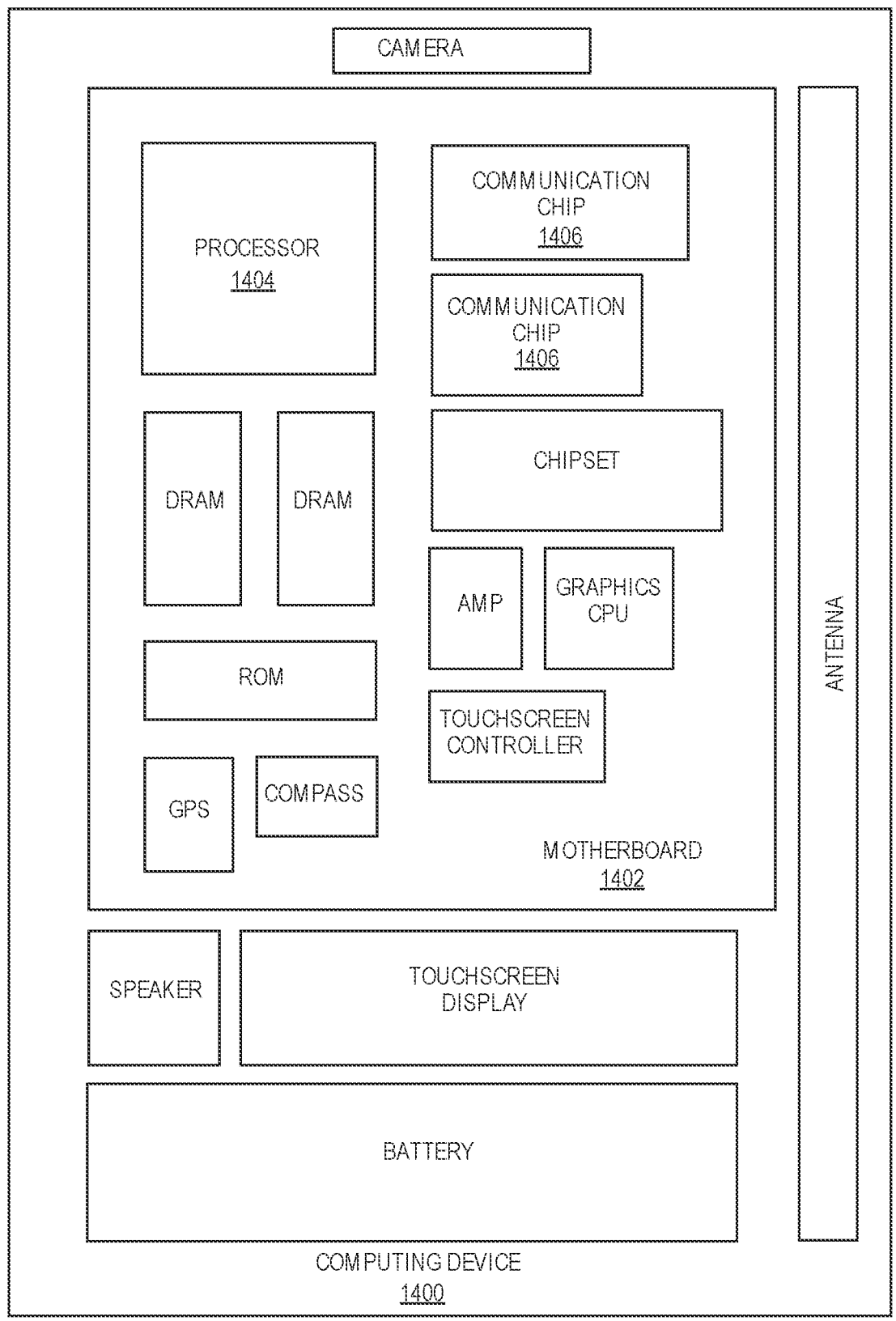
FIG. 14 is a schematic of a computing device built in accordance with an embodiment.

FIG. 14 illustrates a computing device 1400 in accordance with one implementation of the disclosure. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the disclosure, the integrated circuit die of the processor may be part of a photonics system that includes a passively aligned lens array coupled with a photonics die, in accordance with embodiments described herein. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the disclosure, the integrated circuit die of the communication chip may be part of a photonics system that includes a passively aligned lens array coupled with a photonics die, in accordance with embodiments described herein.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a photonics package, comprising: a photonics die; a plurality of v-grooves on the photonics die; and a barrier structure proximate the plurality of v-grooves.

Example 2: the photonics package of Example 1, further comprising a lens array optically coupled to a spot size converter on the photonics die, wherein the lens array comprises: a main body; and a plurality of lenses extending out from the main body.

Example 3: the photonics package of Example 2, wherein individual ones of the plurality of lenses are disposed in different ones of the plurality of v-grooves.

Example 4: the photonics package of Example 2 or Example 3, wherein the lens array further comprises: a pair of alignment posts extending out from the main body.

Example 5: the photonics package of Example 4, wherein the alignment posts and the plurality of lenses extend out from a first surface of the main body.

Example 6: the photonics package of Example 4, wherein the alignment posts extend out from a first surface of the main body, and wherein the plurality of lenses extend out from a second surface of the main body.

Example 7: the photonics package of Example 4, wherein the alignment posts are disposed in the v-grooves.

Example 8: the photonics package of Examples 2-7, further comprising: a plurality of waveguides extending through the main body, wherein each waveguide is optically coupled to one of the plurality of lenses; and a saw-tooth pattern on a bottom surface of the main body.

Example 9: the photonics package of Example 8, wherein the saw-tooth pattern sits into the plurality of v-grooves on the photonics die.

Example 10: the photonics package of Examples 2-9, wherein the main body is L-shaped.

Example 11: the photonics package of Example 10, wherein cylindrical pillars extend out from a surface of the main body, and wherein the plurality of lenses are at ends of the cylindrical pillars.

Example 12: the photonics package of Example 11, wherein the cylindrical pillars are set into the plurality of v-grooves on the photonics die.

Example 13: the photonics package of Examples 2-12, further comprising: cylindrical ridges on a first surface of the main body; and a recessed surface on a second surface of the main body, wherein the lenses are on the recessed surface.

Example 14: the photonics package of Example 13, wherein the cylindrical ridges are set into the plurality of v-grooves on the photonics die.

Example 15: a photonics package, comprising: a photonics die; a plurality of v-grooves in the photonics die; a barrier structure proximate the plurality of v-grooves;

and a lens array optically coupled to a spot size converter on the photonics die, wherein the lens array comprises: a fiber housing; a plurality of optical fibers in the fiber housing; and a plurality of lenses at an end of the optical fibers.

Example 16: the photonics package of Example 15, wherein the plurality of optical fibers are set into the plurality of v-grooves on the photonics die.

Example 17: the photonics package of Example 15 or Example 16, wherein the plurality of lenses are discrete bodies from the plurality of optical fibers.

Example 18: the photonics package of Examples 15-17, wherein the plurality of lenses are fabricated as part of the plurality of optical fibers.

Example 19: a photonics system, comprising: a board; a package substrate coupled to the board; a processor on the package substrate; a photonics die on the package substrate and communicatively coupled to the processor, the photonics die comprising a barrier structure proximate a plurality of v-grooves; and a lens array coupled to an edge of the photonics die.

Example 20: the photonics system of Example 19, wherein the lens array comprises: a main body; and a plurality of lenses extending out from the main body.

Example 21: the photonics system of Example 20, wherein individual ones of the plurality of lenses are disposed in different ones of the plurality of v-grooves.

Example 22: the photonics system of Examples 19-21, wherein the lens array further comprises: a pair of alignment posts extending out from the main body.

What is claimed is:

1. A photonics package, comprising:
a photonics die;
a plurality of v-grooves on the photonics die;
a barrier structure proximate the plurality of v-grooves; and
an underfill material, wherein the barrier structure is between the underfill material and the plurality of v-grooves, and wherein the barrier structure inhibits the underfill material from filling the plurality of v-grooves.

2. The photonics package of claim 1, further comprising:
a lens array optically coupled to a spot size converter on the photonics die, wherein the lens array comprises:
a main body; and
a plurality of lenses extending out from the main body.

3. The photonics package of claim 2, wherein individual ones of the plurality of lenses are disposed in different ones of the plurality of v-grooves.

4. The photonics package of claim 2, wherein the lens array further comprises:
a pair of alignment posts extending out from the main body.

5. The photonics package of claim 4, wherein the alignment posts and the plurality of lenses extend out from a first surface of the main body.

6. The photonics package of claim 4, wherein the alignment posts extend out from a first surface of the main body, and wherein the plurality of lenses extend out from a second surface of the main body.

7. The photonics package of claim 4, wherein the alignment posts are disposed in the v-grooves.

8. The photonics package of claim 2, further comprising:
a plurality of waveguides extending through the main body, wherein each waveguide is optically coupled to one of the plurality of lenses; and
a saw-tooth pattern on a bottom surface of the main body.

9. The photonics package of claim 8, wherein the saw-tooth pattern sits into the plurality of v-grooves on the photonics die.

10. The photonics package of claim 2, wherein the main body is L-shaped.

11. The photonics package of claim 10, wherein a plurality of cylindrical pillars extend out from a surface of the main body, and wherein the plurality of lenses are at ends of the plurality of cylindrical pillars.

12. The photonics package of claim 11, wherein the cylindrical pillars are set into the plurality of v-grooves on the photonics die.

13. The photonics package of claim 2, further comprising:
cylindrical ridges on a first surface of the main body; and
a recessed surface on a second surface of the main body, wherein the lenses are on the recessed surface.

14. The photonics package of claim 13, wherein the cylindrical ridges are set into the plurality of v-grooves on the photonics die.

15. A photonics package, comprising:
a photonics die;
a plurality of v-grooves in the photonics die;
a barrier structure proximate the plurality of v-grooves;
an underfill material, wherein the barrier structure is between the underfill material and the plurality of v-grooves, and wherein the barrier structure inhibits the underfill material from filling the plurality of v-grooves; and
a lens array optically coupled to a spot size converter on the photonics die, wherein the lens array comprises:
a fiber housing;
a plurality of optical fibers in the fiber housing; and
a plurality of lenses at an end of the optical fibers.

16. The photonics package of claim 15, wherein the plurality of optical fibers are set into the plurality of v-grooves on the photonics die.

17. The photonics package of claim 15, wherein the plurality of lenses are discrete bodies from the plurality of optical fibers.

18. The photonics package of claim 15, wherein the plurality of lenses are fabricated as part of the plurality of optical fibers.

19. A photonics system, comprising:
a board;
a package substrate coupled to the board;
a processor on the package substrate;
a photonics die on the package substrate and communicatively coupled to the processor, the photonics die comprising a barrier structure proximate a plurality of v-grooves;
an underfill material, wherein the barrier structure is between the underfill material and the plurality of v-grooves, and wherein the barrier structure inhibits the underfill material from filling the plurality of v-grooves; and
a lens array coupled to an edge of the photonics die.

20. The photonics system of claim 19, wherein the lens array comprises:
a main body; and
a plurality of lenses extending out from the main body.

21. The photonics system of claim 20, wherein individual ones of the plurality of lenses are disposed in different ones of the plurality of v-grooves.

22. The photonics system of claim 20, wherein the lens array further comprises:

a pair of alignment posts extending out from the main body.

\* \* \* \* \*